(12) United States Patent
Micou

(10) Patent No.: US 11,863,207 B2
(45) Date of Patent: **\*Jan. 2, 2024**

(54) DYNAMIC DICTIONARY-BASED NETWORK COMPRESSION

(71) Applicant: Improbable Worlds Ltd, London (GB)

(72) Inventor: Charles Micou, London (GB)

(73) Assignee: Improbable Worlds Limited, London (GB)

( * ) Notice: Subject to any disclaimer, the term of this patent is extended or adjusted under 35 U.S.C. 154(b) by 0 days.

This patent is subject to a terminal disclaimer.

(21) Appl. No.: 17/849,311

(22) Filed: Jun. 24, 2022

(65) Prior Publication Data

US 2023/0006690 A1 Jan. 5, 2023

Related U.S. Application Data

(63) Continuation of application No. 17/148,005, filed on Jan. 13, 2021, now Pat. No. 11,405,054.

(51) Int. Cl.
*H03M 7/30* (2006.01)
*H04L 69/04* (2022.01)
*H04L 67/01* (2022.01)
*A63F 13/35* (2014.01)

(52) U.S. Cl.
CPC .......... *H03M 7/3088* (2013.01); *A63F 13/35* (2014.09); *H04L 67/01* (2022.05); *H04L 69/04* (2013.01)

(58) Field of Classification Search
CPC ....... H03M 7/3088; H04L 67/01; H04L 69/04
See application file for complete search history.

(56) References Cited

U.S. PATENT DOCUMENTS 9,137,528 B1\* 9/2015 Wu .................. H04N 19/00
10,277,658 B2\* 4/2019 Belshe .............. H04L 9/40
2011/0222596 A1\* 9/2011 Huang ............ H03M 7/3084
375/240

\* cited by examiner

*Primary Examiner* — Minh Chau Nguyen
(74) *Attorney, Agent, or Firm* — Banner & Witcoff, Ltd.

(57) ABSTRACT

Methods and systems for providing dynamic dictionary-based compression and decompression are described herein. A computing device may receive, during a currently running session with a client device, a plurality of messages. The computing device may determine, based on the plurality of messages, one or more frames. The computing device may determine, based on the one or more frames, data samples. The computing device may compress the one or more frames based on a compression dictionary. The computing device may train, during the currently running session, the compression dictionary based on the determined data samples, to create a new compression dictionary. The computing device may determine, during the currently running session and based on receiving additional messages, one or more additional frames. In addition, the computing device may compress the one or more additional frames based on the new compression dictionary.

20 Claims, 10 Drawing Sheets

DYNAMIC DICTIONARY-BASED NETWORK COMPRESSION

CROSS REFERENCE TO RELATED APPLICATIONS

This Application claims priority to U.S. application Ser. No. 17/148,005, filed Jan. 13, 2021. The disclosure of the prior application is incorporated herein by its entirety.

FIELD

Aspects described herein generally relate to data communications protocols for computers, networking, hardware, and software. More specifically, some aspects described herein relate to a dynamic dictionary-based compression and decompression mechanism to reduce bandwidth needs for data communications.

BACKGROUND

In an online video game, it is important to reduce the amount of traffic sent by a server to clients without compromising the original data. Network compression techniques are used to compress game data. For example, dictionaries can be used to compress data packets that are sent to various clients. Existing dictionary-based compression techniques rely on data from game sessions that have already concluded to train the dictionaries used for future communication.

As one example, existing game development tools may use some sort of compression in their networking stacks to reduce network bandwidth. The open-source Godot game engine may use Zlib, Zstandard (ZSTD), or a range-cover algorithm to compress its network packets. But dictionaries are not used for data compression. As another example, other compression tools, such as RAD Game Tools' Oodle, may provide a compressor that supports using a dictionary for compressing game data. However, data samples may be taken from game sessions that have already concluded, and those samples may be used to perform offline training of a dictionary. Oodle may be initialized with a dictionary when a game session starts (e.g., before players can connect), and once initialized that dictionary is not changed or updated. A different dictionary may be used when the server restarts or when the players are disconnected. These game network techniques do not achieve ideal compression ratios and/or network bandwidth for game networking, because there are inefficiencies as data changes over time, but before a game session has concluded.

BRIEF SUMMARY

The following presents a simplified summary of various aspects described herein. This summary is not an extensive overview, and is not intended to identify key or critical elements or to delineate the scope of the claims. The following summary merely presents some concepts in a simplified form as an introductory prelude to the more detailed description provided below.

To overcome limitations in the prior art described above, and to overcome other limitations that will be apparent upon reading and understanding the present specification, aspects described herein are directed to dynamic dictionary-based network compression and decompression.

One or more aspects described herein provide a method for dynamic dictionary-based network compression. The method may comprise receiving, during a currently running session with a client device, a plurality of messages associated with changes to one or more states maintained by the server device. The method may further comprise determining, based on the plurality of messages, one or more frames. Each frame may comprise at least one of the plurality of messages. The method may further comprise determining, based on the one or more frames, data samples. The method may further comprise compressing the one or more frames based on a compression dictionary. The method may further comprise training, during the currently running session, the compression dictionary based on the determined data samples, to create a new compression dictionary. The method may further comprise determining, during the currently running session and based on receiving additional messages, one or more additional frames. The method may further comprise compressing the one or more additional frames based on the new compression dictionary.

In various embodiments, the method may be performed by a data processing device, system and/or apparatus. In yet other embodiments the method may be embodied within a non-transitory computer-readable medium. The non-transitory computer-readable medium may store instructions which, when executed by a processor, cause a data processing system, device, or apparatus to perform a method for dynamic dictionary-based network compression as further described herein.

BRIEF DESCRIPTION OF THE DRAWINGS

A more complete understanding of aspects described herein and the advantages thereof may be acquired by referring to the following description in consideration of the accompanying drawings, in which like reference numbers indicate like features, and wherein.

DETAILED DESCRIPTION

In the following description of the various embodiments, reference is made to the accompanying drawings, which form a part hereof, and in which is shown by way of illustration various embodiments in which aspects described herein may be practiced. It is to be understood that other embodiments may be utilized and structural and functional modifications may be made without departing from the scope of the described aspects and embodiments. Aspects described herein are capable of other embodiments and of being practiced or being carried out in various ways. Also, it is to be understood that the phraseology and terminology used herein are for the purpose of description and should not be regarded as limiting. Rather, the phrases and terms used herein are to be given their broadest interpretation and meaning. The use of "including" and "comprising" and variations thereof is meant to encompass the items listed thereafter and equivalents thereof as well as additional items and equivalents thereof. The use of the terms "connected," "coupled," and similar terms, is meant to include both direct and indirect mounting, connecting, coupling, positioning and engaging.

Figure 1:
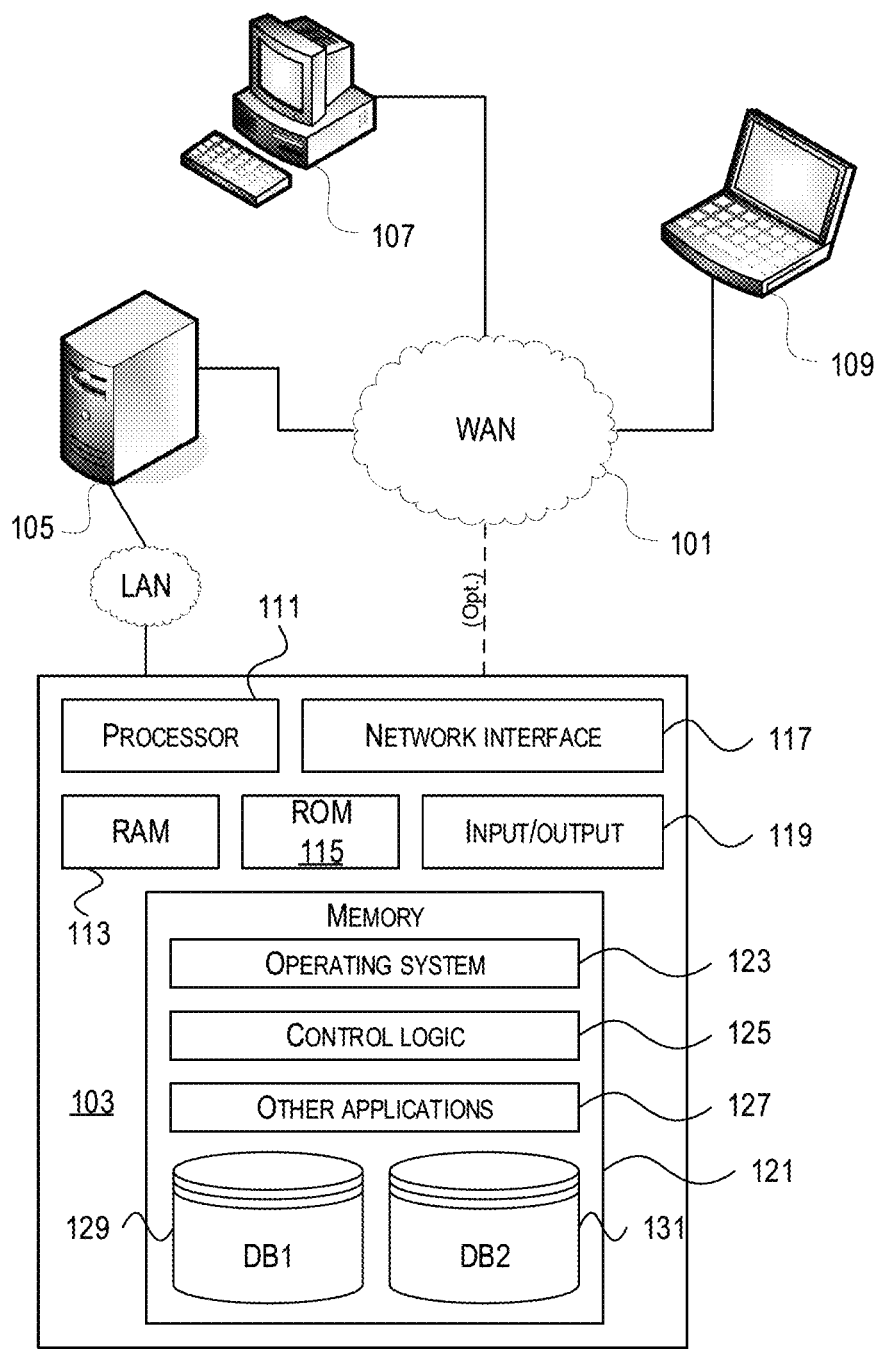
FIG. 1 illustrates an example of a network architecture and data processing device.

FIG. 1 illustrates one example of a network architecture and data processing device that may be used to implement one or more illustrative aspects described herein. Various network nodes 103, 105, 107, and 109 may be interconnected via a wide area network (WAN) 101, such as the Internet. Other networks may also or alternatively be used, including private intranets, corporate networks, LANs, wireless networks, personal networks (PAN), and the like. A network 101 is for illustration purposes and may be replaced with fewer or additional computer networks. A local area network (LAN) may have one or more of any known LAN topology and may use one or more of a variety of different protocols, such as Ethernet. Devices 103, 105, 107, 109 and other devices (not shown) may be connected to one or more of the networks via twisted pair wires, coaxial cable, fiber optics, radio waves or other communication media.

The term "network" as used herein and depicted in the drawings refers not only to systems in which remote storage devices are coupled together via one or more communication paths, but also to stand-alone devices that may be coupled, from time to time, to such systems that have storage capability. Consequently, the term "network" includes not only a "physical network" but also a "content network," which is comprised of the data—attributable to a single entity—which resides across all physical networks.

The components may include a data server 103 (e.g., a spatial simulation runtime, SpatialOS Runtime by Improbable Worlds Ltd.), a web server 105, and client computers 107, 109. The data server 103 provides overall access, control and administration of databases and control software for performing one or more illustrative aspects described herein. The data server 103 may be connected to the web server 105 through which users interact with and obtain data as requested. Alternatively, the data server 103 may act as a web server itself and be directly connected to the Internet. The data server 103 may be connected to the web server 105 through the network 101 (e.g., the Internet), via direct or indirect connection, or via some other network. Users may interact with the data server 103 using the remote computers 107, 109, e.g., using a web browser to connect to the data server 103 via one or more externally exposed web sites hosted by web server 105. The client computers 107, 109 may be used in concert with the data server 103 to access data stored therein, or may be used for other purposes. For example, from the client device 107 a user may access the web server 105 using an Internet browser, as is known in the art, or by executing a software application that communicates with the web server 105 and/or the data server 103 over a computer network (such as the Internet).

Servers and applications may be combined on the same physical machines, and retain separate virtual or logical addresses, or may reside on separate physical machines. FIG. 1 illustrates just one example of a network architecture that may be used, and those of skill in the art will appreciate that the specific network architecture and data processing devices used may vary, and are secondary to the functionality that they provide, as further described herein. For example, services provided by the web server 105 and the data server 103 may be combined on a single server.

Each component 103, 105, 107, 109 may be any type of known computer, server, or data processing device. The data server 103, e.g., may include a processor 111 controlling overall operation of the rate server 103. The data server 103 may further include RAM 113, ROM 115, network interface 117, input/output interfaces 119 (e.g., keyboard, mouse, display, printer, etc.), and memory 121. I/O 119 may include a variety of interface units and drives for reading, writing, displaying, and/or printing data or files. The memory 121 may further store operating system software 123 for controlling overall operation of the data processing device 103, control logic 125 for instructing the data server 103 to perform aspects described herein, and other application software 127 providing secondary, support, and/or other functionality which may or might not be used in conjunction with other aspects described herein. The control logic may also be referred to herein as the data server software 125. Functionality of the data server software may refer to operations or decisions made automatically based on rules coded into the control logic, made manually by a user providing input into the system, and/or a combination of automatic processing based on user input (e.g., queries, data updates, etc.).

The memory 121 may also store data used in performance of one or more aspects described herein, including a first database 129 and a second database 131. In some embodiments, the first database 129 may include the second database (e.g., as a separate table, report, etc.). That is, the information can be stored in a single database, or separated into different logical, virtual, or physical databases, depending on system design. The devices 105, 107, 109 may have similar or different architecture as described with respect to the device 103. Those of skill in the art will appreciate that the functionality of the data processing device 103 (or the device 105, 107, 109) as described herein may be spread across multiple data processing devices, for example, to distribute processing load across multiple computers, to segregate transactions based on geographic location, user access level, quality of service (QoS), etc.

One or more aspects described herein may be embodied in computer-usable or readable data and/or computer-executable instructions, such as in one or more program modules, executed by one or more computers or other devices as described herein. Generally, program modules include routines, programs, objects, components, data structures, etc. that perform particular tasks or implement particular abstract data types when executed by a processor in a computer or other device. The modules may be written in a source code programming language that is subsequently compiled for execution, or may be written in a scripting language such as (but not limited to) HTML or XML. The computer executable instructions may be stored on a computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects, and such data structures are contemplated within the scope of computer executable instructions and computer-usable data described herein.

Figure 2:
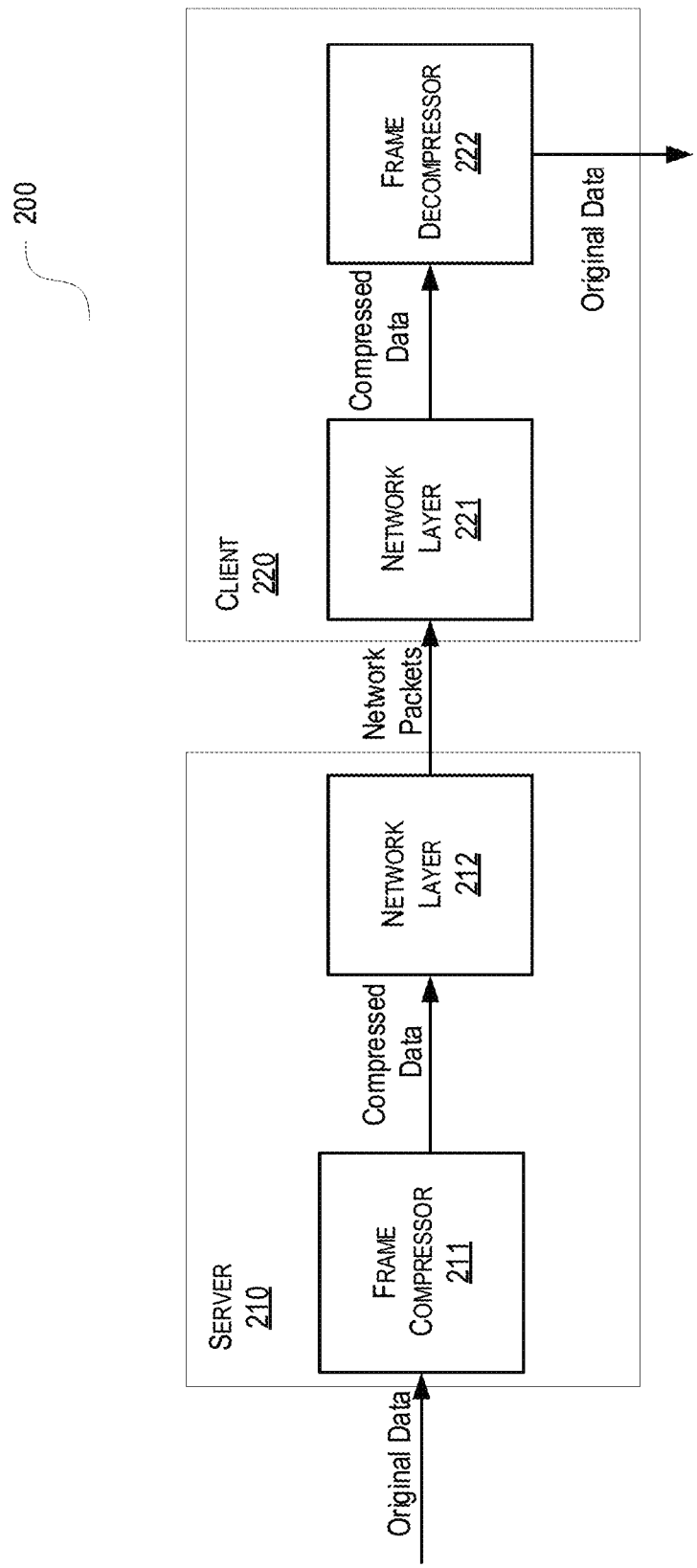
FIG. 2 is a block diagram illustrating an example system for lossless data compression and decompression according to one or more illustrative aspects described herein.

FIG. 2 is a block diagram illustrating an example system for lossless data compression and decompression according to one or more illustrative aspects described herein. In FIG. 2, a system 200 may comprise a server 210 (e.g., the data server 103, the web server 105, a game server, a spatially-optimized simulator, a spatial simulation runtime) and one or more clients 220 (e.g., the client computers 107, 109, mobile phones, tablets, game terminals, worker connections). The server 210 may compress the data before sending the data to the client 220. For example, in order for multi-player games to be played over the Internet, a server and a client may need to exchange game data over a network. Compression may be used to reduce the amount of network bandwidth needed, thereby resulting in a better user experience. The user experience is enhanced by 1) compressing data to fit within the maximum transmission unit (MTU) size of a data packet, thereby reducing data fragmentation, 2) by reducing the total number of packets needed to send data, thereby saving bandwidth and improving speed, and/or 3) providing a more stable game experience by reducing the likelihood of data loss (stated differently, it is more likely to lose a packet when more packets are sent than it is to lose a packet when fewer packets are sent), among other benefits as further discussed herein.

The server 210 may be a computing device configured to compress (e.g., encode data in lossless manner that takes less bandwidth to transmit than the original data) data frames and send the compressed data frames to the client 220. The data frames may comprise one or more network messages (e.g., worker protocol messages) to be sent to the client 220. The one or more worker protocol messages may comprise information associated with updates of a view (e.g., a piece of state shared between the server 210 and the client 220). For example, the view may be a game state shared between the server 210 and the client 220. In a video game, a view may comprise information indicating the positions and/or states of one or more entities (e.g., players, cars, trees) and/or artificial intelligence (AI) characters in the game world, map information associated with the one or more entities and/or other components of the game, and/or leaderboard information. The client 220 may be a computing device configured to receive the compressed data frames and decompress the data frames. The client 220 may then extract the information from the decompressed data frames and apply the updates of the view to a current view on the client 220 (e.g., an agreed view between the server 210 and the client 220 at a given time point).

The server 210 may comprise a frame compressor 211 and a network layer 212. The frame compressor 211 may receive data from one or more computing devices (e.g., one or more game servers, one or more client devices, the client 220) and compress the data so that the compressed data may be in a form that uses fewer bytes. For example, the frame compressor 211 may receive worker protocol messages from one or more worker connections (e.g., a server-worker instance, a client-worker instance, worker modules). The worker protocol messages may be buffered until the end of a tick and may be grouped or otherwise included into one or more data frames before sending to the client 220. A data frame may be an effective unit of compression that collects a plurality of worker protocol messages, serving as a block of data as perceived by the frame compressor 211 and a data sampling system. The quantity of messages to be included in a data frame may be determined based on a time period or interval during which the messages are received by the frame compressor 211. The server 210 may operate in a tick-based cycle. A tick may refer to an iteration of a main or primary process thread.

The data frames may be constructed or generated by internally aggregating the worker protocol messages within the network layer 212. In addition, the network layer 212 may send data packets (e.g., network packets) comprising the compressed data to the client 220 using one or more network protocols over a communication channel (e.g., the Internet) to synchronize the views of all participating workers. The network layer 212 may comprise a networking library or stack (e.g., an Asio library). The network library may be responsible for transmitting the data frames to the client 220 over the communication channel. Additional details of the network layer and the networking library will be described in connection with FIGS. 4, 5A, and 5B.

The client 220 may comprise a network layer 221 and a frame decompressor 222. The network layer 221 may receive the data packets from the network layer 212 and send the compressed data (e.g., compressed frames) to the frame decompressor 222. The frame decompressor 222 may receive the compressed data and decompress the compressed data. In order to decompress the compressed data, the frame decompressor 222 may need to know the compression algorithm that was used for compressing the data. Decompressing the compressed data thus reconstructs the original data (e.g., the worker protocol messages) that was received by the frame compressor 211. In this case, the system 200 may be a lossless system because the original data has been perfectly reconstructed from the compressed data. The compressing and decompressing techniques described herein may relate to lossless compression that allows the original data to be perfectly reconstructed from the compressed data. While "lossy" algorithms could be used, the game states might become unsynchronized as a result, so lossless compression algorithms are preferred.

Figure 3:
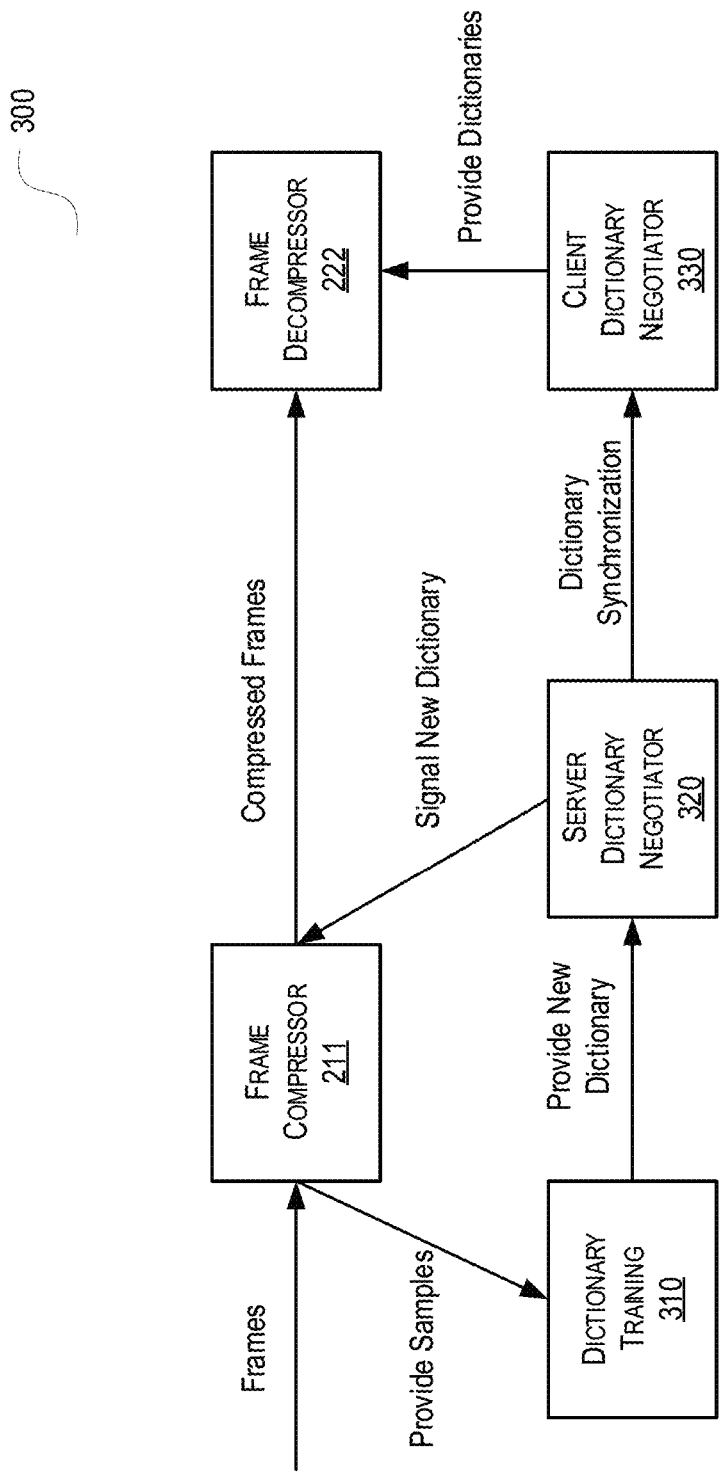
FIG. 3 is a block diagram illustrating an example system for dictionary-based data compression and decompression according to one or more illustrative aspects described herein.

FIG. 3 shows a block diagram illustrating an example system for dictionary-based data compression and decompression according to one or more illustrative aspects described herein. A compression and decompression system 300 may comprise the frame compressor 211, the frame decompressor 222, a dictionary training module 310, a server dictionary negotiator 320, and a client dictionary negotiator 330.

As described above, the frame compressor 211 may compress the data frames. For example, the frame compressor 211 may compress the data frames based on one or more compression algorithms. A software library (e.g., ZSTD and LZ4) may bundle together compression algorithms in a way that software developers may readily use them. The software library may support one or more dictionaries that describe the characteristics of the data. For example, a dictionary may be a piece of metadata that describes common patterns in a data source, external to the frame compressor 211, the frame decompressor 222, and the data being compressed/decompressed. The dictionary may allow the frame compressor 211 and the frame decompressor 222 to compress and decompress the data frames according to one or more specific rules.

Depending on the compression algorithm in use, the contents of a dictionary and how the compression algorithms may be different. For example, in arithmetic coding algorithms, the compression algorithm may be designed to better adapt to a stream of data. A dictionary may comprise a fake history of data to start the compression process. As another example, in Huffman coding, a dictionary might comprise one or more symbol trees. For example, "0000" may correspond to "alice," "001" may correspond to "bob," and "100" may correspond to "charlie." A dictionary may use one or a combination of the coding techniques.

Dictionaries may be constructed by or through a training process. The construction of a dictionary may comprise providing representative samples of data to a training algorithm. The frame compressor 211 may achieve a higher compression ratio if the samples are more representative of actual data that is to be sent between devices. A real-time estimate of an expected compression ratio may be calculated to determine how much data to include in a frame, with a margin of error accounting for variance in the compression ratio. The dictionary training module 310 may ingest samples of uncompressed data frames and periodically produce a new dictionary. Dictionaries may be trained based on network traffic from previous sessions (e.g., previous visual sessions, previous deployments of a game). But training a dictionary based on network traffic from a current session (e.g., the current deployment of a game) and then sending a new dictionary to the client 220 may achieve a higher compression ratio. For example, when the data frames correspond to the usage patterns of game networking, training a dictionary during runtime based on fresh data samples may achieve a higher compression ratio than using stale data from a previous game session. The current session may comprise a duration of time during which an individual user (e.g., player) stays connected to a game server without being asked to connect or reconnect to the game server. The current session may end when the user is disconnected from the game server or the user is asked to join or rejoin a game.

In general, using a dictionary may improve the compression ratio and the throughput of compressors. In order to decompress data compressed using a dictionary, the frame decompressor 222 may need to know if the frame compressor 211 used a dictionary for compressing the data frames, and to have a copy of the same dictionary in order to decompress the compressed data. Stated differently, both the compressor and the decompressor need to be using the same rulebook to translate data between compressed and uncompressed states. The dictionary training module 310 may provide the new dictionary to the server dictionary negotiation 320. The server dictionary negotiator 320 may send a message to the frame compressor 211. The message may signal that a new dictionary has been generated and can be used for compressing data frames. The server dictionary negotiator 320 may also send the new dictionary to the frame compressor 211. After receiving the new dictionary, the server dictionary negotiator 320 may synchronize the new dictionary with the client (e.g., the client 220). For example, the server dictionary negotiation 320 may transfer (e.g., send) the new dictionary to the client dictionary negotiator 330. The client dictionary negotiator 330 may then provide the new dictionary to the frame decompressor 222. The frame decompressor 222 may receive the new dictionary from the client dictionary negotiator 330 and send a message to the server. The message may comprise information indicating that the frame decompressor 222 has obtained the new dictionary. Additional details of dictionary negotiation will be described in connection with FIGS. 9 and 10.

Figure 4:
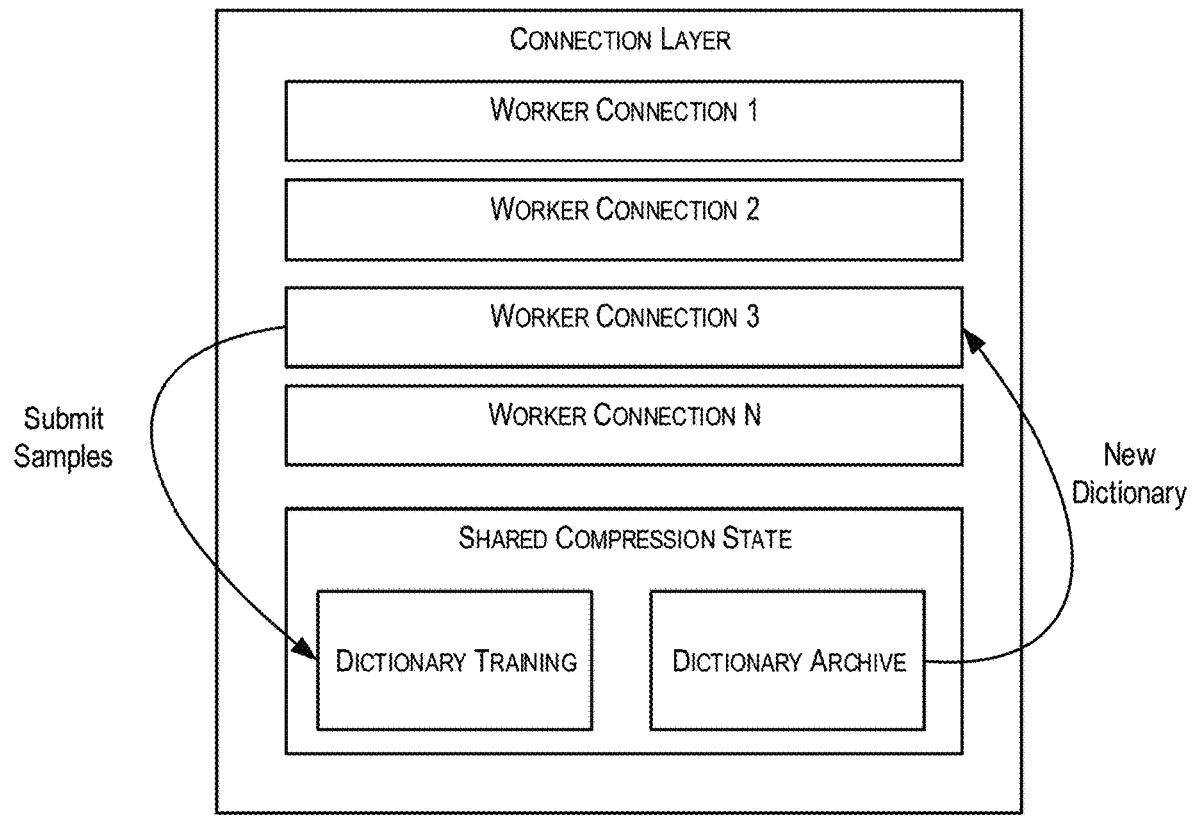
FIG. 4 illustrates an example of a shared state among different worker connections according to one or more illustrative aspects described herein.

FIG. 4 illustrates an example of a shared state among different worker connections according to one or more illustrative aspects described herein. For example, FIG. 4 illustrates a shared state among different worker connections running within an instance of a network library. Each worker connection may be associated with a client device (e.g., the client 220). The shared state may comprise pools of data frames collected from one or more worker connections, dictionary training logics and algorithms, and/or a dictionary archive. Because data frames may be pooled from a plurality of worker connections, a dictionary may be trained based on the pooled samples from the plurality of worker connections. The dictionary training logics and algorithms may comprise training dictionaries based on the pooled samples and/or scheduling for dictionary retraining. The dictionary archive may comprise already constructed dictionaries for use by compression logic within a given worker connection.

Network protocol implementations may expose an API to enable submitting data frames to training, and accepting a new dictionary to synchronize to a client (e.g., the client 220). The size of the data frames may be determined based on the network protocols or stacks used for transmitting the data frames. For example, in the transmission control protocol (TCP) or an automatic repeat request protocol, a large data frame may achieve a better compression ratio. If an MTU cannot comprise the entire compressed frame, the network packets may be fragmented. It may be easy to reconstruct the compressed frames based on the fragmented network packets. A TCP implementation may choose to compress frames before fragmentation to bring the size of data packets beneath the MTU, because reliable delivery methods reconstructing a compressed block sent as several packets may be more tractable or manageable.

However, in the user datagram protocol (UDP), compressing a frame and then fragmenting the frame for later reconstruction may increase the packet loss rate, because the decompressor may need each fragment of the compressed frame to decompress the compressed frame, and UDP does not guarantee packet delivery. Losing one fragment sent via UDP (or similar "best efforts" protocol) may result in losing all fragments and/or adding additional latency and complexity to the protocol for resending the lost fragment. As a result, the size of the frame may be reduced to ensure that the size of each compressed frame is smaller than the MTU, so that each network packet may be decompressed in its entirety. For example, frames may be compressed either after or alongside fragmentation, so that packet loss might not be amplified.

Figure 5:
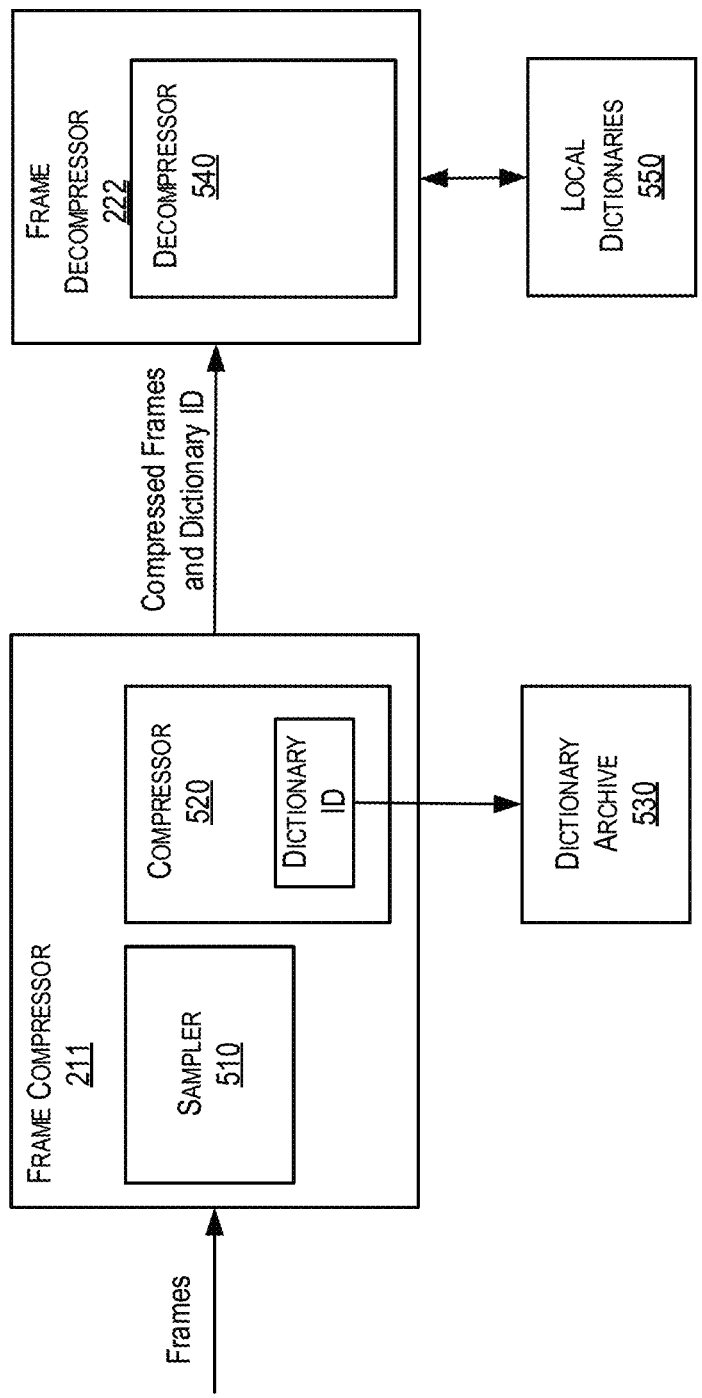
FIG. 5 illustrates an example of dictionary-based compression and decompression structure according to one or more illustrative aspects described herein.

FIG. 5 illustrates an example of a dictionary-based compression and decompression structure according to one or more illustrative aspects described herein. In FIG. 5, the frame compressor 211 may comprise a sampler 510 and a compressor 520. The sampler 510 may be configured to select and determine frames to be compressed. Additional details of the sampler 510 will be described in connection with FIG. 6. The compressor 520 may retrieve a dictionary ID from a dictionary archive 530. The dictionary archive 530 may comprise one or more dictionaries for compressing data frames.

The dictionary ID may reference the raw bytes corresponding to the dictionary and/or the compression settings to use with the dictionary. For example, the dictionary may be indicated by a single byte, with a value 0 corresponding to "no compression in use." The dictionary ID may be unique per worker connection, and might not be associated with a global dictionary ID that identifies a global dictionary. If a client is connected for a long period that the client has cycled through a whole byte's worth of dictionary IDs, the dictionary ID may start again from the beginning. The number of dictionaries currently in use by a single worker connection at any one time may be small enough to be represented by a single byte or in some cases a single bit. A global dictionary may be used by all clients and may be constantly updated by the server 210. But clients may use different dictionaries so that the dictionaries are more particular to the data associated with each client.

The frame compressor 211 may be a per-worker connection structure that takes data frames as an input and outputs a string of bytes which comprise the dictionary ID and the compressed data. The frame compressor 211 may call the sampler 510, which may or might not record a data sample of each frame before performing compression. The frame compressor 211 may determine (e.g., select), based on a dictionary ID, a dictionary from the dictionary archive 530 for compressing the data frames. The dictionary used for compression may change between compressing different sets of frames.

The frame decompressor 222 may comprise a frame decompressor 540 that receives the string of bytes output by the frame compressor 211. The frame decompressor 222 may retrieve a dictionary from local dictionaries 550 based on the received dictionary ID and decompress the the compressed data using the dictionary referenced by the dictionary ID. The local dictionaries 550 may store a plurality of dictionaries that are also included in the dictionary archive 530. The dictionaries stored in the dictionary archive 530 may be constantly synchronized with the dictionaries stored in the local dictionaries 550.

Figure 6:
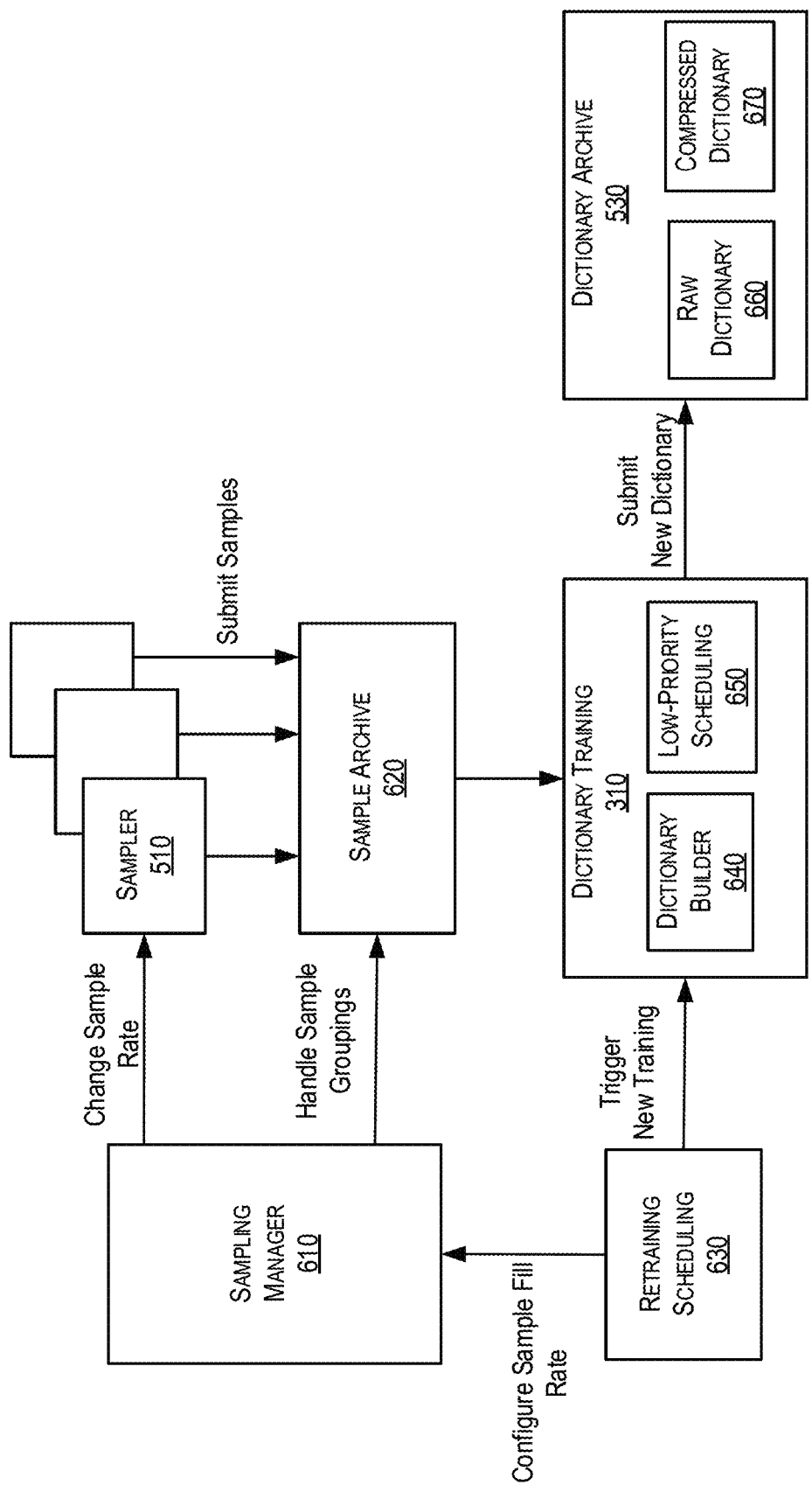
FIG. 6 is a block diagram illustrating an example system for dynamic dictionary training according to one or more illustrative aspects described herein.

FIG. 6 is a block diagram illustrating an example system for dictionary training according to one or more illustrative aspects described herein. In FIG. 6, a sampling manager 610 may be a program module, executed by a frame compressor (e.g., the frame compressor 211) or the server 210, that manages and/or controls the sampler 510 and a sample archive 620. The sampler 510 may be configured to probabilistically select frames to be sent to a client for inclusion in a sample group. The sampler 510 may submit samples to the sample archive 620. The sample archive 620 may store the samples and provide the samples to the dictionary training module 310. In some examples, when a frame is sampled, it may belong to a sample group, and data from these sample groups may be submitted to the sample archive 620. The sample archive 620 may then provide the data received from the sample archive 620 to the dictionary training module 310.

The number of samples that the sampler 510 submits to the sample archive 620 may depend on the dictionary training algorithms and/or libraries. For example, for ZSTD, the dictionary size may be set to be approximately 100× the size of the average uncompressed frame size. An example range of a dictionary size may be between 100 kB and 500 kB. A size of 128 kB may be set as the default dictionary size. For LZ4, the dictionary size might not exceed 64 kB. In general, the volume of the training data may be at least approximately 20× the dictionary size to achieve reasonable compression results. Compression ratios may increase with more samples, but the gains may taper off substantially or completely when the volume of the training data is more than 100-200× the dictionary size.

Clients may be allowed to configure their dictionary size. A recommended default dictionary size for ZSTD may be 128 kB and a recommended default dictionary size for LZ4 may be 64 kB. In addition, clients may be allowed to configure their sample size. For example, a recommended default minimum number of samples to train a dictionary may be 5,000, and a recommended default maximum number of samples to train a dictionary may be 20,000.

The sample manager 610 may configure and determine the sample fill rate of samplers based on (1) the target number of samples before retraining, (2) the number of connections contributing to a sample group, and/or (3) the rate of frames being sent to workers. For example, the sample manager 610 may configure and determine the sample fill rate of samplers to produce roughly the maximum number of samples during the time period of a retraining interval. The sample manager 610 may determine the retraining interval based on, for example, the minimum number of dictionary samples, the maximum number of dictionary samples, and/or the maximum dictionary size. In the case of producing too few samples, the sample group may retain old samples to meet the maximum number of samples. In the case of producing too many samples, the sample group may behave as a first in, first out (FIFO) queue (e.g., the sampler may discard or remove the oldest samples).

The dictionary training module 310 may comprise a dictionary builder 640 and a low-priority scheduling module 650. The dictionary builder 640 may change (e.g., update) the dictionary in use for a connection between a server (e.g., the server 210) and one or more clients (e.g., the client 220) in the same session (e.g., the same game session) without disconnecting the users (e.g., the players).

Data samples selected from a session associated with one or more clients may be applied to the next session associated with the same one or more clients. A game may have many sessions running at the same time. For example, if Alice, Bob, and Charlie play in game session 1 together, and Danielle, Erika, and Freya play in game session 2 together, then dictionaries trained from the data in game session 1 may be applied to the players in game session 1, and the dictionaries trained from the data in game session 2 may be applied to the players in game session 2. This may be because the samples from session 1 may be more representative of future data in session 1, while samples from session 2 may be more representative of future data in session 2.

An uptime (e.g., a game-uptime) may refer to how long a server is running without restarting, irrespective of how long users are connected. For example, massively multiplayer online role-playing game games (MMORPG), such as World of Warcraft and Runescape, may have game servers that have relatively long uptimes (e.g., restart once per week). Round-based games such as Fortnite and League of Legends may have game servers that run only for the length of the game round (e.g., 30 minutes). The duration (e.g., length) of a session may refer to how long an individual user (e.g., player) stays connected to the server. The length of a session might not be longer than the game uptime and may depend on the type of the game. For example, a player may stay connected to the large MMORPG games for several hours, so the duration of a session may be approximately several hours. In contrast, a player may stay connected to the round-based games until the round is over (or until the player is eliminated), so the duration of a session may be approximately 30 minutes or less.

The dictionary training module 310 may perform dictionary training while a session is running to produce better dictionaries. For example, the dictionary training module 310 may perform dictionary training on live game data while a game is running (e.g., during a live game session). In this way, the dictionary training module 310 may perform periodic retraining to make sure the dictionary contents are trained based on fresh samples (e.g., live samples). To ensure that the dictionary contents come from fresh samples (e.g., live samples) for performing periodic dictionary retraining, the samples of packets may be recorded while the game is running in real-time and the sample of packets may be sent to dictionary training on a regular basis.

A retraining scheduling module 630 may trigger new dictionary training for the dictionary training module 310. For example, the retraining scheduling module 630 may determine and set one or more intervals for retraining the dictionaries. The timescale on which to retrain dictionaries may vary based on the types of the games, how frequently new players join the game, and/or which parts of the game the new players are interacting with. Additionally or alternatively, clients may determine and adjust the retraining intervals. In some examples, 10 minutes may be set as a default retraining interval. Intervals smaller than 5 minutes and larger than 30 minutes might not be optimal for retraining dictionaries.

In some examples, the first dictionary might not be generated until the first sampling period (e.g., 10 minutes) is complete, which may be a significant portion of deployment length that might be run without a dictionary. To solve that problem, all the data packets (e.g., network packets) sent to the clients may be submitted as data samples so that a dictionary may be trained as soon as possible. Additionally or alternatively, clients may store dictionaries trained on similar deployments and use one or more of those dictionaries as an initial dictionary. The retraining scheduling module 630 may trigger dictionary training as soon as the data samples are ready. Clients may also download, upload, and/or configure their first dictionary and might not rely on the server to generate and synchronize the first dictionary.

Training dictionaries based on one or more sets of samples may be computationally expensive relative to other networking tasks. In order to perform dictionary training while a game is running and not to starve out the game server of resources to simulate the game, the gameplay experience may be prioritized over the new dictionary data. The low-priority scheduling module 650 may schedule dictionary training asynchronously on a low priority thread, which may allow the OS-level scheduling to handle prioritization. In this way, for example, the quality of a visual simulation (e.g., a game) as perceived by a client might not be affected by deferring and/or amortizing the training stage until sufficient computational capacity is available.

Additionally or alternatively, for game servers running on few cores, spare time between game networking ticks may be used for dictionary training. For example, if a game server (e.g., the server 210) needs to tick at $1/60$th of a second, but may sometimes only need $1/120$th of a second to perform regular functions, the game server may have an additional $1/120$th of "spare time" to perform dictionary training. For game servers running on many cores, one or more cores may be reserved to be used for asynchronously training dictionaries.

After training the dictionaries, the dictionary training module 310 may compress the trained dictionaries and provide the compressed dictionaries to the dictionary archive 530. The dictionary archive 530 may comprise raw dictionaries 660 and compressed dictionaries 670. The raw dictionaries may be generated by decompressing the compressed dictionaries. The dictionary archive 530 may also comprise dictionary metadata associated with each dictionary.

Further, to improve the compression ratio, it may be beneficial to pool samples among clients and to create a dictionary that draws from the data supplied by two or more clients. In this way, fewer dictionaries may need to be trained and kept in a memory. A data sample pooling scheme may group clients that have high data affinity (e.g., data co-occurrences associated with the clients) to share training samples. A degree of data affinity may be determined based on correlations and/or similarities of game properties associated with the clients. For example, the dictionary training module 310 may select samples and group samples into pools of related players based on game properties. In this way, dictionaries may be trained sooner (e.g., by reaching the minimum amount of required data faster) and higher compression ratios may be achieved (e.g., by the locality in a game world).

Sample pools may be determined according to the groupings of clients. The grouping of clients may be determined by sending one or more queries on client descriptions (e.g., client game start time, client's character level and/or location). Clients that share the same or similar descriptions may be grouped. Additionally or alternatively, sample pools may be automatically determined by comparing how well a set of samples compress against previous (e.g., archived) dictionaries, and samples that better fit the previous dictionaries may be grouped. For example, when sampling one or more frames for a client and determining which sample pool to add them to, the frame compressor 211 may attempt to compress the frame with one or more archived dictionaries retrieved from the dictionary archive 530. The sampling manager 610 may observe the compression ratio achieved with each of the archived dictionaries and rank the archived dictionaries by how well they compress the frame. The sampling manager 610 may select the archived dictionary that achieves the highest compression ratio. If the sample pool corresponding to the selected dictionary is oversubscribed (e.g., exceed a threshold number of clients), the sampling manager 610 may select the archived dictionary that achieves the second-best compression ratio. The client may then be added to the sample pool that fits the selected dictionary.

Sample pools may be determined by sending one or more queries on the data contained within the data frames and samples of individual clients. The mapping between a client and a sample pool may be updated. For example, a client may leave one pool for another pool that has a higher level of data affinity. The mapping relations between the client and the pools may be updated to reflect the changes in data affinity. In addition, for session-based games that have relatively small player counts, it might not be advantageous to periodically retrain more than one compression dictionary for each type of player client. Different types of player client may require different types of network connection. For example, a first player client playing a fully-fledged version of a game on a personal computer (PC) may require more game data than a second player client playing a lower-fidelity version of the game on a mobile phone or a third player client playing on a console or an older PC. For games that involve a larger number of players, grouping together clients that have strong data affinity for each other to share dictionaries may yield higher compression ratios. Therefore, sample grouping may be used instead of tightly coupling player client type to dictionaries. In some examples, the sample pools may be determined based on both the player client type and the data affinity among the clients.

Figure 7:
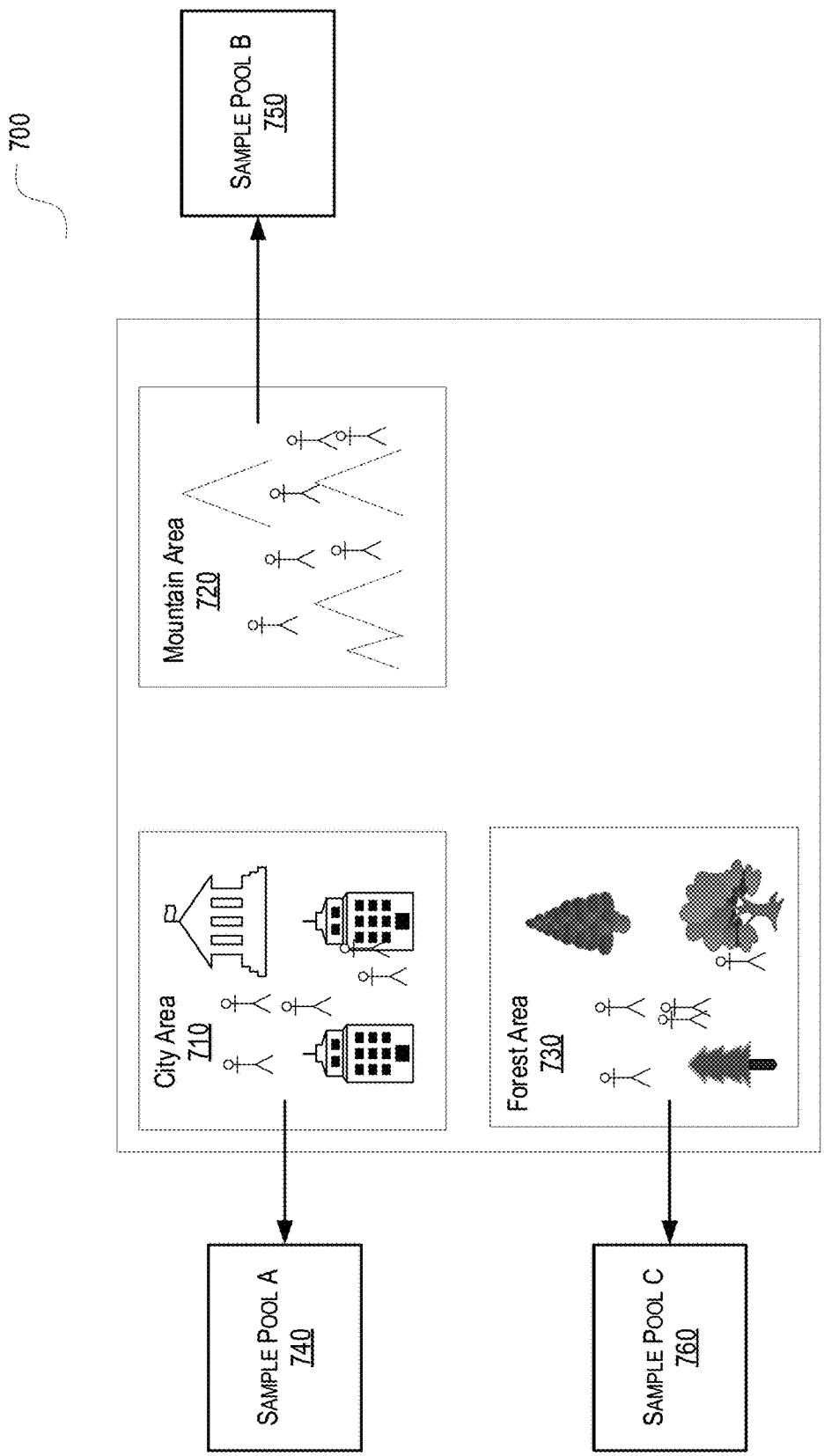
FIG. 7 illustrates an example of sample pools for dictionary training according to one or more illustrative aspects described herein.

FIG. 7 illustrates an example of sample pools for dictionary training according to one or more illustrative aspects described herein. In FIG. 7, a simulated world 700 may comprise a city area 710, a mountain area 720, and a forest area 730. In some simulations (e.g., games), the nature of either the changing world or the changes in player behaviors in the simulation may result in different types of data being sent from the server to clients. For example, in play-testing and development, most players may be in the forest area 730. If we used samples of network data from this play-testing to train a dictionary, the dictionary may be well-suited to compress data from the forest area 730, but may be less suited to data from other areas such as the city area 710 or the mountain area 720.

For example, players may move from the forest area 730 to the mountain area 720. A new dictionary may be generated to improve the compression ratio because the patterns of data coming from a different part of the game may be sufficiently different. As another example, if the simulated world 700 is mutable, the players may build a new area (e.g., a lake area) or move to a new area in the simulated world 700. The new area might not be featured anywhere in the original training samples, so the original dictionary might not be well suited to compress data from the new area of the simulated world 700.

Data samples may be selected and pooled together based on locations associated with players. For example, data associated with players who are in similar locations in the game world may be grouped into the same sample pools. In this way, the data samples may be specific to the players and may improve the compression ratio and accuracy. As shown in FIG. 7, a sample pool A 740 may be determined based on the data associated with the players in the city area 710, a sample pool B 750 may be determined based on the data associated with the players in the mountain area 720, and/or a sample pool C 760 may be determined based on the data associated with the players in the forest area 730.

Additionally or alternatively, data samples may be grouped or pooled based on game data. For example, data samples may be grouped based on what team (e.g., faction, alliance, clan) the players belong to, what in-game activities (e.g., fighting, building, trading) the players are participating in, and/or game-specific indicators, such as a player's character level (e.g., in MMORPG the player's character level may indicate which area the character might go to next). The optimal size of the sample groups (e.g., number of players) may depend on the nature of the game. In general, grouping players together may be better than treating players as individuals in a group-of-one, or treating all players together in a group-of-all in terms of the amount of network bandwidth saved and the compression ratios.

Figure 8:
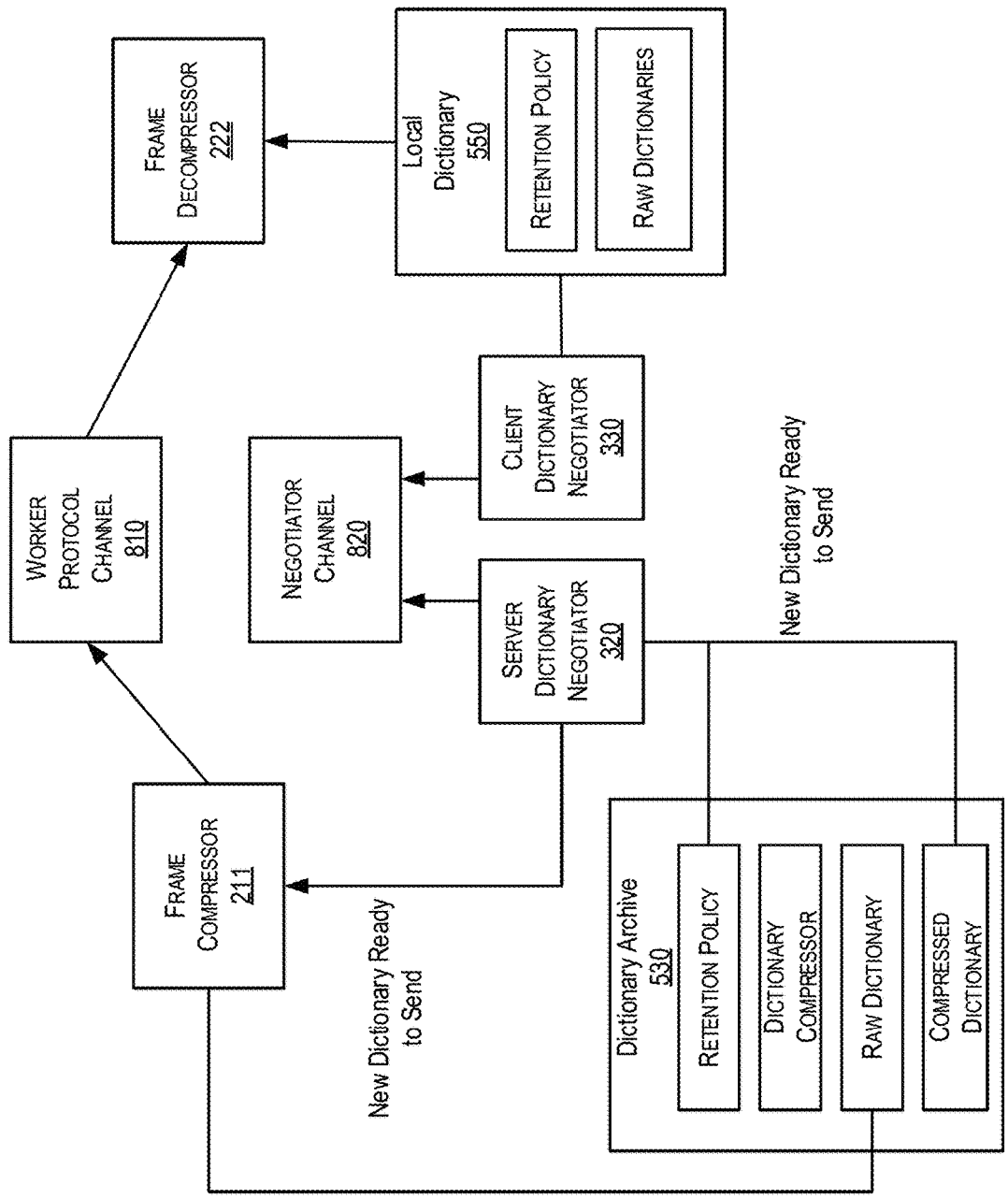
FIG. 8 is a block diagram illustrating an example system for dictionary negotiation according to one or more illustrative aspects described herein.

FIG. 8 is a block diagram illustrating an example system for dictionary negotiation according to one or more illustrative aspects described herein. dictionary negotiation may be needed to synchronize dictionaries between a server (e.g., the server 210) and a client (e.g., the client 220). The client might not receive data packets that contain data compressed with a dictionary unknown to the client (e.g., the client does not possess or have access to the dictionary). To solve this problem, the server might only send data packets that contain data compressed with a dictionary that the server knows that the client has the same dictionary. For example, the server dictionary negotiator 320 might not provide the frame compressor 211 with a dictionary unknown to the client.

In FIG. 8, the server dictionary negotiator 320 may receive a new dictionary from the dictionary archive 530 and may send the new dictionary to the client dictionary negotiator 330 via a negotiator channel 820. The negotiator channel 820 may be different from a worker protocol channel 810 between the frame compressor 211 and the frame decompressor 222 because the worker protocol channel 810 may be lossy and/or unordered. The negotiator channel 820 may be a lower priority channel than the worker protocol channel 810. The worker protocol channel 810 may be used for transmitting worker protocol messages between the framer compressor 211 and the frame decompressor 222. The client dictionary negotiator 330 may add the new dictionary to the local dictionary 550 so that the frame decompressor 222 may retrieve the new dictionary from the local dictionary 550 and may decompress future frames (e.g., frames that compressed based on the new dictionary) using the new dictionary. The local dictionary 550 may store the old dictionary for at least a period of time based on a lifetime of packets being sent (e.g., time to live (TTL) of the packets) after a new dictionary is loaded because the client may still receive data compressed with an old dictionary.

In some examples, dictionaries might not fit inside an MTU because the size of an uncompressed dictionary may be larger than 100 kB. Therefore, dictionaries may be compressed before being sent to the client. For example, dictionaries may be compressed using static compression methods such as ZSTD and Zlib. The client dictionary negotiator 330 may send the compressed dictionaries and the metadata describing the compression of the dictionaries to the client dictionary negotiator 330. Because dictionaries may be shared between different clients, the server 210 may store a copy of the compressed dictionaries in the dictionary archive 530.

Because the amount of data a game server desires to send to a client in a given data packet may be less than the MTU, dictionaries may be fragmented and the fragments of dictionaries may fill spare space in the data packets. For example, if a size of a data packet is 1500 bytes, and a server intends to send 1000 bytes of game data to a client, 500 bytes of dictionary data may be filled in the data packet and sent to the client. In this way, new dictionaries may be gradually transmitted without interfering with game data.

Additionally or alternatively, the server may upload the dictionary and/or dictionary-related information to external storage, such as a content delivery network (CDN), and may send a key to the client to retrieve the dictionary from the external storage. This allows the client to retrieve the dictionary based on its own schedule. Additionally or alternatively, a low-priority channel as part of the networking layer (e.g., an additional TCP connection) may be established and used between the server and the client. The low-priority channel may be used to transmit dictionaries and/or dictionary-related information.

The dictionary archive 530 may store each dictionary produced by the dictionary training module 310. In addition, the dictionary archive 530 may store information (e.g., timestamps) indicating when each dictionary was created and/or trained, information indicating which sample group the dictionary belongs to, the raw dictionary itself, a dictionary ID associated with the raw dictionary, a description of the compression settings that may be used with this dictionary (e.g., the LZ4 or ZSTD), a compressed version of the dictionary to send via the negotiator channel 820, and/or a description of how the dictionary was compressed (e.g., the ZSTD). The dictionary archive 530 may comprise one or more retention policies that specify how long the dictionaries and the related information may be stored. In addition, because a worker connection's frame compressor may only use one dictionary at a time, the retention policy may specify what dictionaries may be stored and/or when to remove the dictionaries from the dictionary archive 530. For example, the retention policy may state that: "Retain all dictionaries in use by at least one worker connection. Retain the latest dictionary for each sample group. Eventually remove all other dictionaries."

If a client tries to decompress a data packet using the wrong dictionary, a client may fail to decompress the packet or may obtain the wrong packet contents. Because data packets may be reordered over the network, so the dictionary archive 530 may store the old dictionary for a short period of time (e.g., a few seconds) during the transition period between the old dictionary and the new dictionary. The server may indicate with every packet which dictionary (e.g., by associating an ID with a dictionary) is in use. When a new dictionary for a sample group is added to the dictionary archive 530, the dictionary archive 530 may need to compress the new dictionary and then notify all the server dictionary negotiators for that sample group that a new dictionary is available.

Figure 9:
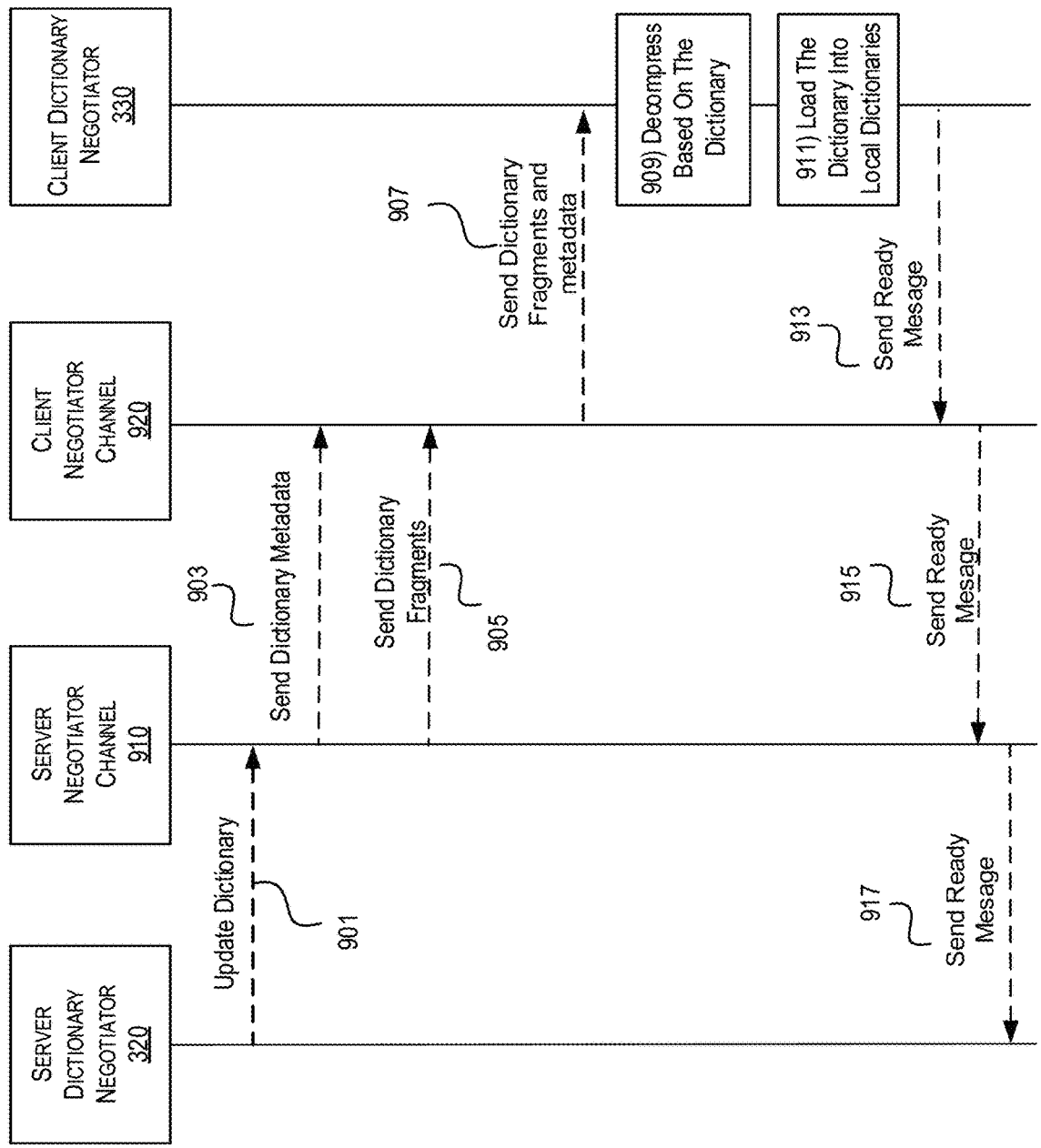
FIG. 9 depicts an example event sequence for dictionary negotiation according to one or more illustrative aspects described herein.

FIG. 9 depicts an example event sequence for dictionary negotiation according to one or more illustrative aspects described herein. The server dictionary negotiator 320 may accept indications (e.g., prompts) from the dictionary archive 530 that a new dictionary (or an update to the existing dictionary) is available. At step 901, the server dictionary negotiator 320 may update the existing dictionary based on the new dictionary. The server dictionary negotiator 320 may send a message to a server negotiator channel 910 (e.g., the negotiator channel 820) indicating that a new dictionary is ready to be sent to the client.

At step 903, the server negotiator channel 910 may send dictionary metadata to a client negotiator channel 920 (e.g., the negotiator channel 820). The implementation of the negotiator channels may be specific to the connection protocol (e.g., TCP) in use. The dictionary metadata may comprise information associated with the new dictionary such as the date and time the new dictionary was created and trained and/or the compression settings associated with the new dictionary.

At step 905, the server negotiator channel 910 may send one or more fragments of the new dictionary to the client negotiator channel 920. Each fragment may be associated with a dictionary ID that uniquely identifies the new dictionary. In some examples, the new dictionary may be compressed based on one or more rules and each fragment may comprise one or more segments of the compressed new dictionary. The server negotiator channel 910 may send the dictionary metadata and all dictionary fragments to the client negotiator channel 920 and complete the dictionary transfer process.

At step 907, the client negotiator channel 920 may send the dictionary metadata and all dictionary fragments to the client dictionary negotiator 330. For example, the client negotiator channel 920 may send the dictionary fragments to the client dictionary negotiator 330 until all dictionary fragments have been received. As another example, the client negotiator channel 920 may immediately transfer the receive the received each individual fragment to the client dictionary negotiator 330.

At step 909, the client dictionary negotiator 330 may receive the dictionary metadata and all dictionary fragments, and decompress the new dictionary based on the dictionary metadata.

At step 911, the client dictionary negotiator 330 may load the decompressed new dictionary into the local dictionaries 550.

At step 913, once the client dictionary negotiator 330 loads the decompressed new dictionary into the local dictionaries 550, the client dictionary negotiator 330 may send a message to the client negotiator channel 920 indicating that the new dictionary has been loaded and is ready to be used for decompressing future data frames.

At step 915, the client negotiator channel 920 may send the received message from the client dictionary negotiator 330 to the server negotiator channel 910.

At step 917, the server negotiator channel 910 may send the received message from the client negotiator channel 920 to the server dictionary negotiator 320. In this way, the server may be informed that the client is able to decompress data frames based on the new dictionary.

Figure 10:
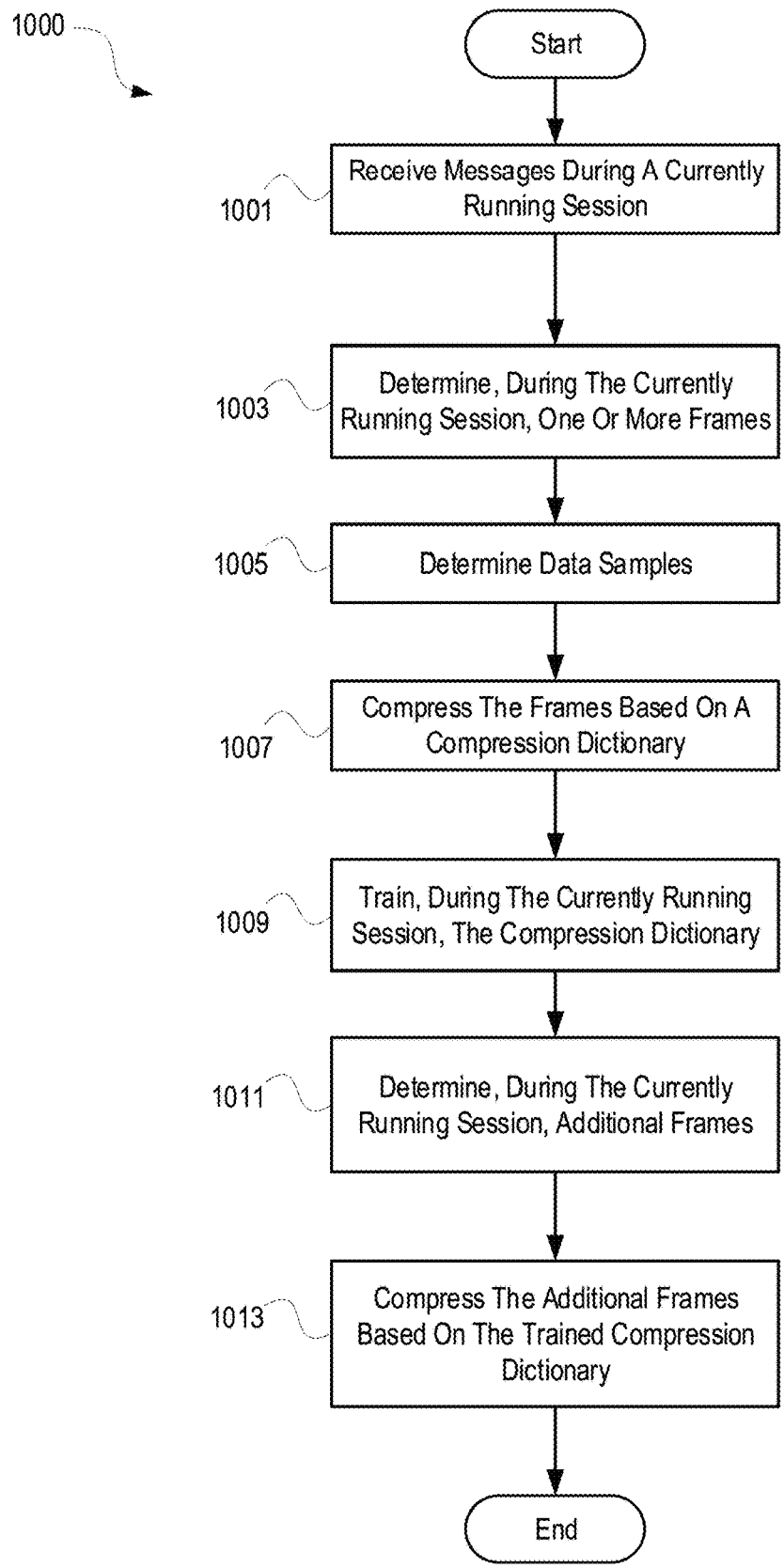
FIG. 10 depicts a flow chart showing an example method for dynamic dictionary-based compression according to one or more illustrative aspects described herein.

FIG. 10 is a flow chart of an example method for dynamic dictionary-based compression according to one or more illustrative aspects described herein. Steps of the method may comprise performing training of a compression dictionary on live data (e.g., live game data) while a session is running. Steps of the method may also distinguish between the collection of data samples and the training of the dictionary. Further, steps of the method may group clients (e.g., the client 220) that have high data affinity to share training samples. The description of FIG. 10 includes examples of computing devices that may perform various steps. However, any or all of those steps (and/or other steps) may be performed by one or more other computing devices. One or more steps may be combined, sub-divided, omitted, or otherwise modified, and/or added to other steps. The order of the steps may be modified.

At step 1001, a computing device (e.g., the server 210) may receive, during a currently running session, a plurality of messages. The plurality of messages may be associated with changes to one or more states. The plurality of messages may comprise worker protocol messages that indicate information (e.g., states maintained by the computing device) related to a visual simulated world (e.g., a game world). For example, one or more messages may comprise information related to the positions of players in a video game. The computing device may receive the plurality of messages from one or more servers and/or client devices (e.g., the client 220). The currently running session may comprise a duration of time during which an individual user (e.g., player) stays connected to a game server without being asked to connect or reconnect to the game server. The currently running session may end when the user is disconnected from the game server or the user is asked to join or rejoin a game.

At step 1003, the computing device may determine, based on the plurality of messages, one or more frames. Each frame may comprise at least one of the plurality of messages. Each frame may be included in a data packet to be sent to one or more client devices. For example, the computing device may determine the one or more frames based on a time period within the currently running session. Each frame may collect all the messages received during the time period within the currently running session. The time period may be predetermined by the computing device and may be adjusted in real-time based on the nature of the game and the number of players that are currently involved in the game.

At step 1005, the computing device may determine, based on the one or more frames, data samples. The computing device may select, during the currently running session, data samples from the frames. For example, the computing device may group the determined one or more frames based on one or more common characteristics associated with the plurality of messages, and determine, based on the grouped frames, the data samples. The one or more common characteristics may comprise information indicating locations associated with clients (e.g., the players in a game). The computing device may also group the determined one or more frames based on other indicators associated with the clients (e.g., player characters' levels, game session start time, whether the players belong to the same team).

At step 1007, the computing device may compress the one or more frames based on a compression dictionary. The computing device may store a plurality of dictionaries for compressing frames. Each dictionary may be used to compress a corresponding set of data samples (e.g., data samples collected from one region of the simulated world). In some examples, one or more client devices (e.g., clients belong to the same group) may share a dictionary for compressing frames associated with the respective client device.

At step 1009, the computing device may train, during the currently running session, the compression dictionary based on the determined data samples. Based on the training of the dictionary, the computing device may generate a new dictionary (e.g., update the existing or previous dictionary). The computing device may periodically train and/or retrain the compression dictionary based on the most recent data samples determined during the currently running session. Because the data samples are determined during the same session that the dictionary is trained, newly received messages during the session may be compressed using the trained and retrained dictionaries.

At step 1011, the computing device may determine, during the currently running session and based on receiving additional messages, one or more additional frames. The additional frames may comprise one or more additional messages. Each frame may be included in a data packet to be sent to one or more client devices.

At step 1013, the computing device may compress the one or more additional frames based on the trained compression dictionary (e.g., the new compression dictionary). The trained compression dictionary may be generated during the currently running session. The computing device may constantly use the newly generated or updated dictionary to compress the future frames and/or frames that are just received but not yet compressed. In some examples, the computing device may send the trained compression dictionary to the client devices. In response to receiving a message that the trained compression dictionary has been received by the client devices, the computing device may start compressing the one or more additional frames based on the trained compression dictionary.

Although the subject matter has been described in language specific to structural features and/or methodological acts, it is to be understood that the subject matter defined in the appended claims is not necessarily limited to the specific features or acts described above. Rather, the specific features and acts described above are disclosed as illustrative forms of implementing the claims.

The invention claimed is:

1. A method comprising:
  receiving, by a server device during a currently running session with a client device, a plurality of messages associated with one or more states maintained by the server device;
  determining, based on the plurality of messages, one or more frames, each frame comprising at least one of the plurality of messages;
  compressing the one or more frames based on a compression dictionary;
  training, during the currently running session, the compression dictionary based on the one or more frames, to update the compression dictionary; and
  compressing, during the currently running session, one or more additional frames based on the updated compression dictionary.

2. The method of claim 1, further comprising:
periodically retraining the compression dictionary based on most recent frames determined during the currently running session.

3. The method of claim 1, further comprising:
generating a dictionary ID that identifies the compression dictionary; and
sending the dictionary ID to at least one computing device to which data will be sent using the identified compression dictionary.

4. The method of claim 1, further comprising:
grouping the one or more frames based on one or more common characteristics associated with the plurality of messages; and
determining, based on the grouped frames, data samples for training the compression dictionary.

5. The method of claim 1, further comprising:
sending, during the currently running session, the updated compression dictionary to at least one computing device.

6. The method of claim 1, further comprising:
fragmenting, based on a size of a data packet that comprises the one or more additional frames, the updated compression dictionary into a plurality of fragments; and
sending the data packet to at least one computing device, wherein the data packet comprises at least one of the plurality of fragments of the updated compression dictionary.

7. The method of claim 1, further comprising:
sending the updated compression dictionary to at least one computing device, wherein the compressing the one or more additional frames comprises:
in response to receiving a message that the updated compression dictionary has been received by the at least one computing device, compressing the one or more additional frames based on the updated compression dictionary.

8. An apparatus comprising:
one or more processors; and
memory storing instructions that, when executed by the one or more processors, cause the apparatus to:
  receive, during a currently running session with a client device, a plurality of messages associated with one or more states maintained by the apparatus;
  determine, based on the plurality of messages, one or more frames, each frame comprising at least one of the plurality of messages;
  compress the one or more frames based on a compression dictionary;
  train, during the currently running session, the compression dictionary based on the one or more frames, to update the compression dictionary; and
  compress, during the currently running session, one or more additional frames based on the updated compression dictionary.

9. The apparatus of claim 8, wherein the instructions, when executed by the one or more processors, cause the apparatus to:
periodically retrain the compression dictionary based on most recent frames determined during the currently running session.

10. The apparatus of claim 8, wherein the instructions, when executed by the one or more processors, cause the apparatus to:
generate a dictionary ID that identifies the compression dictionary; and
send the dictionary ID to at least one computing device to which data will be sent using the identified compression dictionary.

11. The apparatus of claim 8, wherein the instructions, when executed by the one or more processors, cause the apparatus to:
group the one or more frames based on one or more common characteristics associated with the plurality of messages; and
determine, based on the grouped frames, data samples for training the compression dictionary.

12. The apparatus of claim 8, wherein the instructions, when executed by the one or more processors, cause the apparatus to:
send, during the currently running session, the updated compression dictionary to at least one computing device.

13. The apparatus of claim 8, wherein the instructions, when executed by the one or more processors, cause the apparatus to:
fragment, based on a size of a data packet that comprises the one or more additional frames, the updated compression dictionary into a plurality of fragments; and
send the data packet to at least one computing device, wherein the data packet comprises at least one of the plurality of fragments of the updated compression dictionary.

14. The apparatus of claim 8, wherein the instructions, when executed by the one or more processors, cause the apparatus to:
send the updated compression dictionary to at least one computing device, wherein the compressing the one or more additional frames comprises:
in response to receiving a message that the updated compression dictionary has been received by the at least one computing device, compress the one or more additional frames based on the updated compression dictionary.

15. One or more non-transitory computer-readable media storing instructions that, when executed by one or more processors, cause:
receiving, during a currently running session with a client device, a plurality of messages associated with one or more states maintained by a server device;
determining, based on the plurality of messages, one or more frames, each frame comprising at least one of the plurality of messages;
compressing the one or more frames based on a compression dictionary;
training, during the currently running session, the compression dictionary based on the one or more frames, to update the compression dictionary; and
compressing, during the currently running session, one or more additional frames based on the updated compression dictionary.

16. The one or more non-transitory computer-readable media of claim 15, wherein the instructions, when executed by the one or more processors, cause:
periodically retraining the compression dictionary based on most recent frames determined during the currently running session.

17. The one or more non-transitory computer-readable media of claim 15, wherein the instructions, when executed by the one or more processors, cause:
generating a dictionary ID that identifies the compression dictionary; and
sending the dictionary ID to at least one computing device to which data will be sent using the identified compression dictionary.

18. The one or more non-transitory computer-readable media of claim 15, wherein the instructions, when executed by the one or more processors, cause:
grouping the one or more frames based on one or more common characteristics associated with the plurality of messages; and
determining, based on the grouped frames, data samples for training the compression dictionary.

19. The one or more non-transitory computer-readable media of claim 15, wherein the instructions, when executed by the one or more processors, cause:
fragmenting, based on a size of a data packet that comprises the one or more additional frames, the updated compression dictionary into a plurality of fragments; and
sending the data packet to at least one computing device, wherein the data packet comprises at least one of the plurality of fragments of the updated compression dictionary.

20. The one or more non-transitory computer-readable media of claim 15, wherein the instructions, when executed by the one or more processors, cause:
sending the updated compression dictionary to at least one computing device, wherein the compressing the one or more additional frames comprises:
in response to receiving a message that the updated compression dictionary has been received by the at least one computing device, compressing the one or more additional frames based on the updated compression dictionary.

\* \* \* \* \*